United States Patent
Itzler

(10) Patent No.: US 8,969,117 B2
(45) Date of Patent: Mar. 3, 2015

(54) METHOD FOR FORMING A BURIED P-N JUNCTION AND ARTICLES FORMED THEREBY

(71) Applicant: Princeton Lightwave, Inc., Cranbury, NJ (US)

(72) Inventor: Mark Allen Itzler, Princeton, NJ (US)

(73) Assignee: Princeton Lightwave, Inc., Cranbury, NJ (US)

(*) Notice: Subject to any disclaimer, the term of this patent is extended or adjusted under 35 U.S.C. 154(b) by 0 days.

(21) Appl. No.: 13/801,560

(22) Filed: Mar. 13, 2013

(65) Prior Publication Data

US 2013/0207217 A1 Aug. 15, 2013

Related U.S. Application Data

(60) Continuation-in-part of application No. 13/364,790, filed on Feb. 2, 2012, now Pat. No. 8,513,755, which is a continuation of application No. 13/237,546, filed on Sep. 20, 2011, now Pat. No. 8,133,755, which is a division of application No. 12/243,488, filed on Oct. 1, 2008, now Pat. No. 8,044,436, which is a continuation-in-part of application No. 11/682,999, filed on Mar. 7, 2007, now Pat. No. 7,964,435.

(51) Int. Cl.
- *H01L 21/00* (2006.01)
- *H01L 31/09* (2006.01)
- *H01L 31/18* (2006.01)
- *H01L 31/107* (2006.01)

(52) U.S. Cl.
CPC ............... *H01L 31/09* (2013.01); *H01L 31/18* (2013.01); *H01L 31/1075* (2013.01); *H01L 31/184* (2013.01); *Y02E 10/544* (2013.01)

USPC ................................................ 438/48; 438/91

(58) Field of Classification Search
USPC ....................................................... 438/48, 91
See application file for complete search history.

(56) References Cited

U.S. PATENT DOCUMENTS

| 6,015,721 A | 1/2000 | Kim |
| 2006/0081874 A1 | 4/2006 | Francis et al. |
| 2006/0121683 A1 | 6/2006 | Francis et al. |

FOREIGN PATENT DOCUMENTS

EP 1679749 A1 7/2006

OTHER PUBLICATIONS

G.C. Chi, et al., "Planar avalanche photodiode with a low-doped, reduced curvature junction", "Appl. Phys. Lett.", Apr. 27, 1987, pp. 1158-1160, vol. 50, No. 17, Publisher: American Institute of Physics, Published in: Murray Hill, NJ.

(Continued)

*Primary Examiner* — Douglas Menz
(74) *Attorney, Agent, or Firm* — Kaplan Breyer Schwarz & Ottesen, LLP

(57) ABSTRACT

Methods for forming a buried p-n junction and avalanche photodiodes incorporating same are disclosed. The method includes forming a well in a semiconductor layer, wherein a depth of the well is selected as a function of the desired shape of the p-n junction in the edge region of the avalanche photodiode. A diffusion mask is then formed on the semiconductor layer, wherein the diffusion mask includes at least two openings per APD formed, wherein one opening is a diffusion window and the other is a diffusion sink. The depth of the p-n junction in the active region of the APD is based, in part, on an attribute of the diffusion mask relating to the diffusion sink.

11 Claims, 9 Drawing Sheets

(56) References Cited

OTHER PUBLICATIONS

Liu et al., "Simple, very low dark current, planar long-wavelength avalanche photodiode", "Applied Physics Letters", Oct. 3, 1988, pp. 1311-1313, vol. 53, No. 14, Publisher: American Institute of Physics, Published in: US.

Chaudhari, Chandra P., "Related U.S. Appl. No. 11/682,999 Notice of Allowance Feb. 16, 2011", Publisher: USPTO, Published in: US.

Doyle, John, "Related U.S. Appl. No. 11/682,999 Office Action Jun. 30, 2009", Publisher: USPTO, Published in: US.

Chaudhari, Chandra P., "Related U.S. Appl. No. 11/682,999 Office Action Sep. 2, 2010", Publisher: USPTO, Published in: US.

Chaudhari, Chandra P., "Related U.S. Appl. No. 11/682,999 Restriction Requirement May 12, 2010", Publisher: USPTO, Published in: US.

Menz, Douglas M., "Related U.S. Appl. No. 12/243,488 Office Action Mar. 18, 2011", Publisher: USPTO, Published in: US.

Menz, Douglas M., "Related U.S. Appl. No. 12/243,488 Office Action Sep. 20, 2010", Publisher: USPTO, Published in: US.

Chaudhari, Chandra P., "Related U.S. Appl. No. 12/243,488 Restriction Requirement May 3, 2010", Publisher: USPTO, Published in: US.

Menz, Douglas M., "Related U.S. Appl. No. 13/237,546 Notice of Allowance Nov. 7, 2011", Publisher: USPTO, Published in: US.

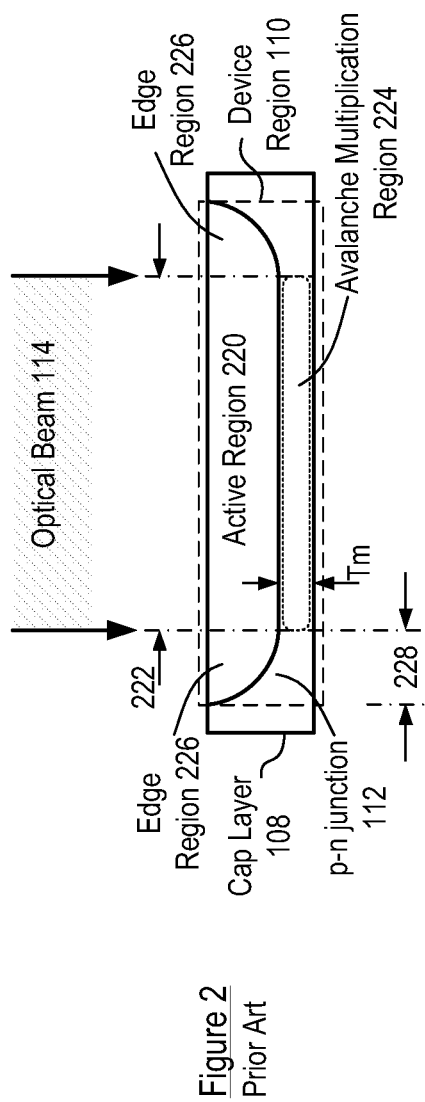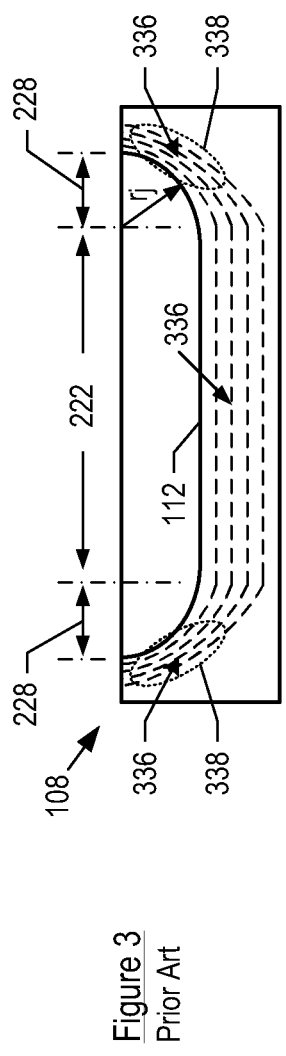
Figure 2
Prior Art
Figure 3
Prior Art

METHOD FOR FORMING A BURIED P-N JUNCTION AND ARTICLES FORMED THEREBY

CROSS REFERENCE TO RELATED APPLICATIONS

This case is a continuation-in-part of U.S. patent application Ser. No. 13/364,790, filed Feb. 2, 2012, which is a continuation of U.S. Pat. No. 8,133,755, which is a division of U.S. patent application Ser. No. 12/243,488 filed Oct. 1, 2008 (now U.S. Pat. No. 8,044,436) which is a continuation-in-part of U.S. patent application Ser. No. 11/682,999 filed 7 Mar. 2007 (now U.S. Pat. No. 7,964,435), each of which is incorporated by reference herein.

FIELD OF THE INVENTION

The present invention relates generally to controlling the diffusion of dopants and more particularly to forming a buried p-n junction.

BACKGROUND OF THE INVENTION

Dopant diffusion is a standard process that is used when fabricating some semiconductor-based devices. One important application for this process is the creation of a buried "p-n junction." A p-n junction is formed when p-type and n-type materials are placed in contact with each other. The junction between the two types of materials behaves very differently than either type of material alone. In particular, current will flow readily in one direction but not in the other, creating the basic diode. This behavior arises from the nature of the charge transport process in the two types of materials.

To create a buried p-n junction via dopant diffusion, a diffusion mask is first formed on a wafer, such as an indium phosphide wafer, on which epitaxially grown layers have been deposited. Typically, the grown layers are characterized by a background concentration of either n-type or p-type dopant, resulting in n-type material or a p-type material, respectively. The mask includes "windows" that are open to the underlying semiconductor at specific regions. The specific arrangement of the windows in the mask is based on the layout and geometry of the devices being formed. Dopant atoms of the type opposite to those in the epitaxially grown layers (i.e., "n" or "p") are delivered to the diffusion mask. The dopant atoms pass through the windows and diffuse to a certain depth in the semiconductor to form p-n heterojunctions. The diffusion process is controlled via parameters such as temperature and dopant partial pressure. Typically, elevated temperature (c.a. 500° C.) is required to achieve reasonable diffusion times.

Essentially the same process can be used to create a homojunction wherein both sides of the junction have the same dopant type, but with very different concentrations thereof.

The buried p-n junction is an important element of many optoelectronic devices, such as the avalanche photodiode ("APD"). An APD is a photodiode that can generate a relatively large electrical current signal in response to receiving a relatively low-power optical signal. Some versions of APDs include an absorption layer that absorbs the energy from light to create free charge carriers and another layer that contains a multiplication region in which the free charge carriers multiply to create a detectable electrical current. APDs with such separate absorption and multiplication regions are referred to as "SAM" APDs.

In operation, an APD is "biased" by applying a voltage across it to create a high electric field. Free electrical carriers generated in the absorption layer are injected into the multiplication region. In the multiplication region, the free carriers are accelerated to a velocity that enables them to create more free carriers through a process called "impact ionization." The resultant additional free carriers are also accelerated by the electric field and create even more free carriers, and so on. This process is referred to as avalanche multiplication, and is responsible for the high responsivity of an APD.

FIG. 1 depicts a cross-sectional view of a conventional SAM APD receiving an optical beam. APD 100 comprises substrate 102, absorption layer 104, charge control layer 106, and cap layer 108. The various layers 104, 106, and 108 are grown on substrate 102. APD 100 is a top-illuminated device; that is, light is received at the uppermost layer of the device. With slight design alterations, such as the location of an anti-reflection layer (not depicted in FIG. 1), an APD can be back illuminated, wherein light is received at the bottommost layer of the APD.

Absorption layer 104 absorbs the optical energy of optical beam 114, as contained within mode-field diameter 116, and generates electrical carriers. The absorption layer can be an intrinsic layer of indium gallium arsenide. Charge control layer 106 permits a low electric field to be maintained in absorption layer 104, while supporting a high electric field in cap layer 108. Charge control layer 106 can be a moderately n-doped layer of indium phosphide.

Cap layer 108 includes device region 110 and p-n junction 112. Cap layer 108 can be a lightly n-doped layer of indium phosphide.

Device region 110 is formed by diffusing a p-type dopant into cap layer 108 to form p-n junction 112. The lateral extent of the p-n junction defines the lateral extent of device region 110. As indicated via the smooth shape of p-n junction 112, it was formed via a single dopant diffusion operation.

As depicted in FIG. 2, which shows further detail of cap layer 108 of the APD depicted in FIG. 1, device region 110 includes active region 220 and edge region 226. Active region 220 is the central portion of device region 110 wherein p-n junction 112 is at a uniform depth (i.e., where p-n junction 112 is a plane junction). In some embodiments, such as the one depicted, width 222 of active region 220 is substantially equal to mode-field diameter 116 of optical beam 114. In some other embodiments, width 222 is made larger than mode-field diameter 116 in order to facilitate optical coupling to optical beam 114.

Avalanche multiplication region 224 is the un-doped portion of active region 220 beneath p-n junction 112. This is a high-field multiplication region in which avalanche multiplication occurs. The avalanche multiplication region 224 has a thickness $T_m$, which is substantially constant across active region 220. Depending upon device design considerations, thickness $T_m$ is a value in the range from 2% to 50% of the thickness of cap layer 108.

Edge region 226, which has width 228, is the outer or peripheral region of device region 110. The edge region is formed by the lateral diffusion of the dopant used to form p-n junction 112. Within edge region 226, p-n junction 112 is non-planar and varies across edge region 226.

FIG. 3 depicts a cross-sectional view of cap layer 108 showing equipotential lines. The junction depth of p-n junction 112 in the active region is approximately equal to diffusion radius $r_j$. In the prior-art APD depicted in FIGS. 1-3, width 222 of the active region 220 is much larger than width 228 of the edge-region and is also much larger than diffusion radius $r_j$.

Two important parameters for an APD are the uniformity of the gain and breakdown voltage across device region 110. The breakdown voltage is the voltage at which the p-n junction is sufficiently reverse-biased to conduct a large current arising from a self-sustaining avalanche process, even in the absence of optical power.

Gain and breakdown voltage are functions of the thickness of the un-doped portion (i.e., the region of cap layer below p-n junction 112) of the device region 110. As previously noted, the active region is characterized by a uniform, planar junction profile, which results in uniform avalanche gain and breakdown voltage, as denoted by the uniform space between equipotential lines 336 in this region. The edge region, however, has a non-uniform, curved junction profile, which gives rise to the well-known "junction-curvature" effect. The junction curvature effect leads to higher electric field intensity and lower breakdown voltage relative to the active region, as denoted by the crowding of equipotential field lines 336 in regions 338. This phenomenon is commonly referred to as "edge breakdown." For practical SAM-APDs, the breakdown-voltage should be sufficiently uniform across the entire device region to ensure that the resulting uniformity of the multiplication gain is within 10%, and preferably within 1%.

A number of approaches for limiting edge breakdown are known in the prior art. These include: 1) adding guard rings outside the junction area to control the doping density at the junction edges; 2) adding a shaped charge control layer underneath the cap layer to enhance the electric field in the active region; and 3) forming a multi-tiered doping profile (i.e., two or more separate dopant diffusions) to reduce the curvature, and therefore the induced local electric field, of the junction profile at the edge of the device region. Common to all these approaches is an enlarged device region and/or more complicated device fabrication, which can lead to lower device yield, higher device cost, and lower device reliability.

A fourth approach to limiting edge breakdown is disclosed in Chi et al., "Planar Avalanche Photodiode with a Low-Doped, Reduced Curvature Junction," Appl. Phys. Lett. 50 (17), 27 Apr. 1987. The authors disclosed that a dish-shaped p-n junction can be used to provide uniform gain without edge breakdown. The dish-shaped junction is formed by etching a dish-shaped recess into an implant mask layer, which is reproduced in the cap layer of the APD. The dish-shaped recess was formed using a photomask that produced a spatial variation of light intensity.

Of late, interest has arisen in the use of APDs for detection of single photons in applications such as cryptography. For single-photon-detection applications, the APD is electrically biased beyond its electrical breakdown voltage, in the so-called "Geiger mode." These devices are often referred to as Geiger-mode (Gm) APDs. A GmAPD that is biased above breakdown can give rise to an easily detectable pulse of electrical current in response to the absorption of even a single photon.

An important performance metric for an APD that is used for single-photon detection application is Noise Equivalent Power (NEP). NEP is a function of the amount of erroneous signals (referred to as the dark count rate) and the optical detection efficiency. A photodiode with low NEP will contribute few false counts while still detecting most or all of the received photons. A low NEP can be achieved by 1) high detection efficiency and/or 2) low dark count rate.

In U.S. Pat. No. 7,378,689, incorporated herein by reference, the present inventor disclosed an APD that provides high optical coupling efficiency and low dark count rate, such as is particularly useful for single-photon detection applications. This patent discloses the dark count rate can be decreased by reducing the volume of the device region. Note that this approach is contra-indicated from the perspective of limiting edge breakdown, at least via traditional approaches 1-3 mentioned above. In some embodiments, the total volume of the device region is reduced by decreasing the width of the edge region. This patent also teaches that the curvature of the junction profile in the edge region (and therefore the gain and breakdown voltage in the edge region) is affected by the ratio of the width of the edge region to: (1) the width of the active region; (2) to the diffusion radius of the dopants in the edge region; and (3) to cap layer thickness. The patent specifies certain ranges for these ratios, providing an APD that operates with low NEP while maintaining a uniform gain profile or uniform breakdown voltage across the device region.

It will be appreciated that APD breakdown voltage is highly dependent upon APD layer structure and the properties of the semiconductor layers from which it is formed. These factors have historically been extremely difficult to control from wafer to wafer, fabrication run to fabrication run, and even across a single wafer within a run. Local variations in process parameters, such as temperature and/or gas flow, can lead to significant variations in the breakdown voltage across a wafer of APD structures.

While it is possible to adjust for a variation in expected breakdown voltage for a single APD, it can be quite complex and costly to measure and compensate for individual breakdown voltages within an array of such devices. For applications in which a plurality of APDs is required, such as in imaging sensors, position sensors, etc., the impact of breakdown voltage variation is, therefore, particularly vexing and problematic. Such variation necessitates costly inspection methods, complex control circuitry, increased cost, and often a degradation of the performance of the APD array.

As a consequence, there remains a need for improved methods for fabricating APDs.

SUMMARY OF THE INVENTION

The present invention provides a way to form a buried p-n junction at a desired depth and with a desired shape/profile. The methods disclosed herein can be exploited to fabricate APDs and APD arrays with desired behavioral characteristics.

In accordance with the illustrative embodiment, a method for forming a buried p-n junction has two key features:
(1) The formation of a well having a desired diameter and depth; and
(2) The formation of a diffusion mask that includes at least two diffusion openings, one of which is a diffusion "sink," for forming a single APD.

The well is etched in a layer of material that is to become, in the context of an APD, the cap layer. The well is etched over the region of the cap layer that is to become the active region of the APD. The diffusion mask is deposited on the cap layer after the well is formed. A first opening in the mask is a diffusion window for forming the device region of the APD and the second opening in the mask, which is formed in the vicinity of the first diffusion window, functions as a "diffusion sink." These features are explained further below.

In many applications, such as single-photon detection, an APD is electrically biased above breakdown. Breakdown voltage is, therefore, an important design parameter for these and other types of APDs. But a primary design consideration for an APD will typically be an operational characteristic, such as multiplication gain, operating speed, noise level, dark current, etc. This characteristic is a function of the intended use for the APD. Knowing the particular application and having decided upon an operational characteristic, those skilled in the art will be able to calculate what the breakdown voltage ought to be to produce an APD that exhibits the desired operational characteristic.

For a given APD structure (e.g., materials, layer thicknesses, layer doping, etc.), the chief determinant of breakdown voltage is depth of the p-n junction in the APD's active region. The depth of the p-n junction is determined by the diffusion depth of the dopant that is diffused to form the device region. There is a well-understood relationship between breakdown voltage and dopant depth in the device region; one can be calculated knowing the other (and other specifics of the opto-electronic device). Over a wide range of diffusion depth, the deeper that dopant diffuses into the semiconductor material that forms an APD's cap layer, the lower the breakdown voltage of the APD. It is this parameter—the depth to which dopant is diffused into the semiconductor—that is actually controlled to form an APD having the desired breakdown voltage and, hence, the desired operating characteristic.

Due to variations in temperature across a wafer, localized mass transport phenomena, loading effects, etc., the depth to which a dopant diffuses into a semiconductor layer is typically quite non-uniform across a wafer surface. In many cases, breakdown voltage variations are not a major issue—particularly where APDs are singulated from the wafer and used individually. In many applications, however, uniform breakdown voltage across an APD array is critical. Examples of such applications include imaging sensors, pixilated detectors, quadrant detectors, position sensors, grouped detectors, object tracking sensors, and the like. Further, in some applications it is advantageous to apply a controlled variation in breakdown voltage across an array to, for example, counteract other device differences that might arise due to processing variations, material variations, etc.

The aforementioned considerations are addressed primarily by feature "2;" a diffusion mask that includes a diffusion sink.

This feature is incorporated into methods disclosed by applicant in U.S. Pat. Nos. 7,964,435, 8,044,436, 8,133,755, and U.S. Publ. Pat. App. No. 2012/0133014. Those methods can be used to precisely control the depth of a buried p-n junction. In the context of APDs and APD arrays, the methods provide a way, for example, to: (a) vary diffusion depth from device-to-device during a single execution of a diffusion process; (b) provide a uniform diffusion depth during a single execution of a diffusion process when device geometry dictates different-size diffusion windows in the mask (which would otherwise result in different diffusion depths during a single execution of the diffusion process); and (c) to precisely control dopant diffusion depth.

The methods disclosed in those patent publications are based on a relationship, discovered by the applicant, between the depth to which a dopant diffuses and the presence of a diffusion "sink." In particular, it was found that the depth to which a dopant diffuses through a first opening (i.e., the diffusion window) at the first location in a diffusion mask can be controlled by controlling an attribute of a second opening (i.e., the diffusion sink) at a second location located in the diffusion mask. The controlled attribute can be, without limitation, (i) a size of the diffusion sink, (ii) the separation between the diffusion window and the diffusion sink, or (iii) a combination of (i) and (ii).

The diffusion sink functions by limiting the amount of additional dopant that would otherwise pass through the diffusion window by virtue of surface diffusion from impassable regions of the diffusion mask. This additional dopant would affect the depth of the p-n junction and, hence, breakdown voltage. The diffusion sink effectively limits unfettered access to the diffusion window, thereby providing improved control over the amount of dopant that actually passes through the diffusion window. This enables more precise/accurate control over the depth to which dopants diffuse and, as a result, breakdown voltage. This applies to the fabrication of a single APD as well as the fabrication of arrays of APDs, such as are fabricated across a wafer.

Although the methods disclosed in the referenced patent publications can be used to control the depth to which dopants diffuse, they have virtually no effect on the shape of the resulting p-n junction in the edge region. That shape is dictated, rather, by the diffusion properties inherent to the dopant element (e.g., Zn, etc.) and the host substrate (e.g., InP, etc.).

In U.S. Pat. No. 7,378,689, previously referenced, applicant disclosed that the curvature of the junction profile in the edge region (and therefore the gain and breakdown voltage in the edge region) is affected by the ratio of the width of the edge region to: (1) the width of the active region; (2) to the diffusion radius of the dopants in the edge region; and (3) to cap layer thickness. The '689 patent teaches that maintaining these ratios in a certain range provides an APD having a uniform gain profile or uniform breakdown voltage across the device region (and operates with low NEP). To the extent that APD is performed via a single diffusion, the size of the active region of the APD is limited to a range of about $0.5R_{de}$ to about $2R_{de}$, where $R_{de}$ is the diffusion radius of the dopant. One can use multiple dopant diffusions to adjust the profile of the edge region, but this substantially complicates processing. Among other difficulties, it makes it more difficult to achieve a desired breakdown voltage for an APD.

Methods disclosed herein extend the utility of the methods disclosed in U.S. Pat. Nos. 7,964,435, 8,044,436, 8,133,755, and U.S. Publ. Pat. App. No. 2012/0133014, and overcome the size limitations disclosed in U.S. Pat. No. 7,378,689 by providing a measure of control over the shape of the p-n junction via feature "1," the presence of a "well." The well enables the profile of the peripheral portion of the p-n junction (i.e., the portion of the p-n junction in the edge region) to be somewhat flattened compared to what it would otherwise would be. This "relaxed" curvature reduces junction curvature effects, thereby reducing the tendency toward a decrease in breakdown voltage in the edge region. The well therefore enables an APD to be formed with a relatively wider active region than would be possible under the constraints of U.S. Pat. No. 7,378,689. And this wider active region can be formed using a single dopant diffusion.

BRIEF DESCRIPTION OF THE DRAWINGS

FIG. 2 depicts further detail of the cap layer of the APD of FIG. 1.

FIG. 3 depicts equipotential electric field lines for the APD of FIG. 1.

DETAILED DESCRIPTION

Although presented in the specific context of an APD, the teachings of the present invention can be adapted for the formation of other devices that incorporate a buried p-n junction.

Definitions. The terms appearing below are defined for use in this disclosure and the appended claims as follows:

"Device region" is a region within a semiconductor that provides the functionality of a certain device, such as that of an APD.

"Diffusion mask" is a patterned layer of material that is resistant to the diffusion of a dopant other than at openings in the mask.

"Diffusion region" means a region of semiconductor that is doped during the same dopant-diffusion process. In some instances, a diffusion region comprises a plurality of distinct, non-contiguous regions within it (e.g., a device region and a dopant sink); however, these distinct non-contiguous regions are doped at the same time during the same diffusion process.

"Diffusion sink" is an opening in a diffusion mask that is distinct from any openings in the diffusion mask through which dopants passes to form a device region.

"Dopant sink" is a region within the semiconductor below the diffusion sink into which dopants diffuse.

"Lightly doped" refers to the intentional doping of a semiconductor layer with an n-type or p-type dopant to a dopant concentration that is less than three orders of magnitude greater than the background concentration of the semiconductor layer.

Figure 4:
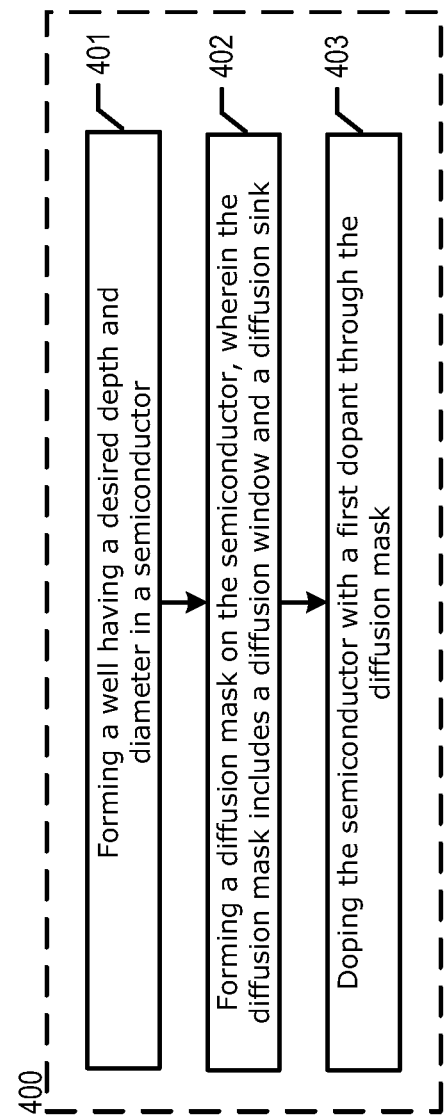
FIG. 4 depicts a method in accordance with the illustrative embodiment of the present invention.

FIG. 4 depicts method 400 for forming a buried p-n junction in accordance with the illustrative embodiment of the present invention. Method 400 comprises operations 401, 402, and 403. These operations are described in conjunction with FIGS. 5A through 5F, which illustrate a fabrication sequence for implementing method 400.

Figure 1:
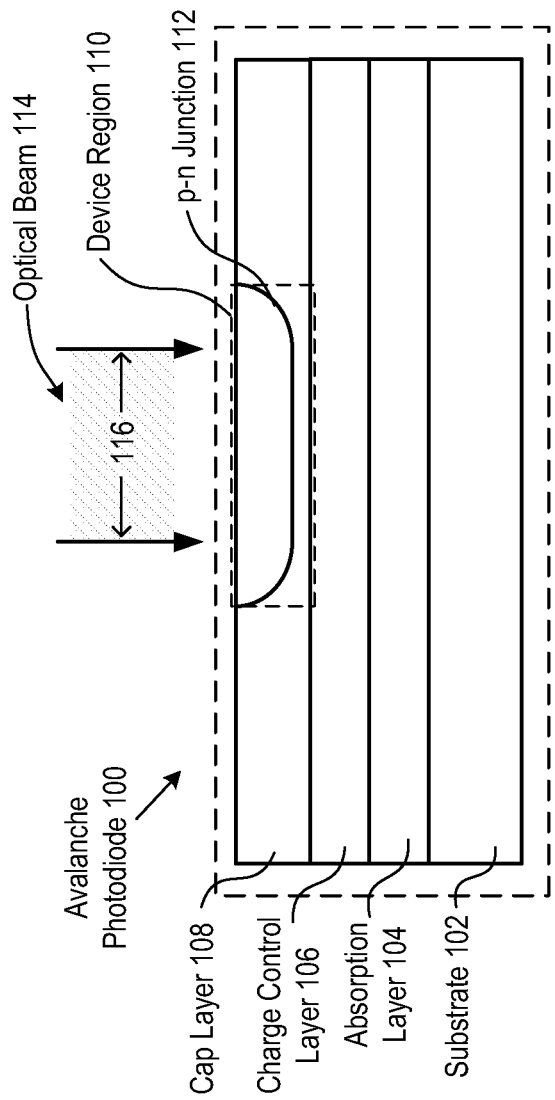
FIG. 1 depicts a cross-sectional view of a conventional APD.

As an aid to understanding, the method will be described in the context of forming an APD. As depicted in FIG. 1, a SAM APD includes a substrate layer, an absorption layer, a charge control layer, and a cap layer. Since the formation of layers other than the cap layer are not germane to an understanding of the present invention and are within the capabilities of those skilled in art, they will not be discussed further herein except as useful for background or context. After reading this disclosure, those skilled in the art will know how to apply the present teachings to form various types of APDs as well as other semiconductor devices that contain a buried p-n junction.

Operation 401 recites "forming a well" in a semiconductor. In the context of an APD, the well is formed in what will be the cap layer of the APD. An etch mask is used to form the well.

Figures 5A, 5B, 5C:
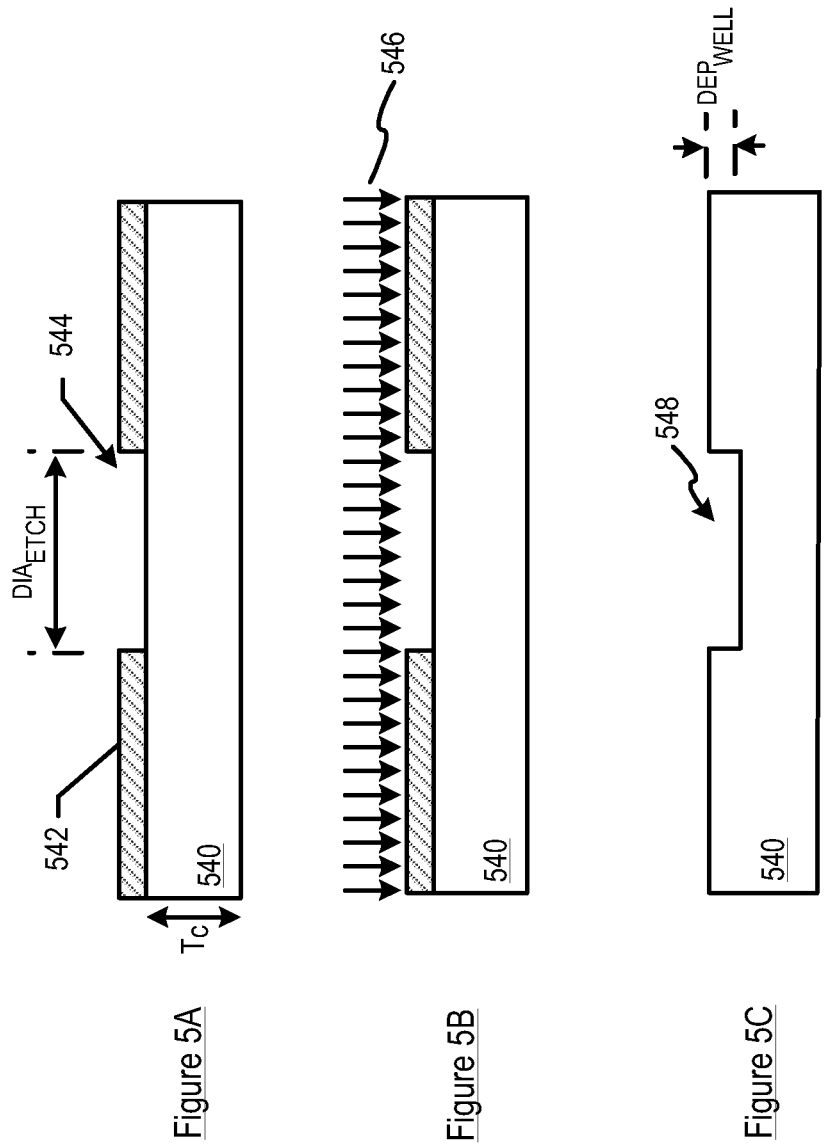
FIGS. 5A-5F depict a fabrication sequence for forming an APD in accordance with the method of FIG. 4.

Referring now to FIG. 5A, etch mask 542 is formed on semiconductor layer 540. Layer 540 will be the cap layer of an APD. In some embodiments, layer 540 is a lightly n-doped layer of indium phosphide. In some embodiments, layer 540 has thickness, $T_c$, of about 4 microns.

Etch mask 542 is formed by depositing a mask layer on layer 540 using conventional deposition techniques. The mask layer is then patterned using conventional photolithography and etching techniques to form etch mask 542, which includes (typically) circular opening 544. The mask layer is suitable for preventing layer 540 from being etched, by whatever technique is being used, at any region other than below opening 544. For embodiments in which layer 540 is indium phosphide, reactive ion etching ("RIE") can be used as the etching technique. Suitable materials for an RIE mask layer include, without limitation, silicon nitride and silicon dioxide. Alternatively, layer 540 can be etched by wet etching techniques. Those skilled in the art will know how to make and use an etch mask for the purpose of etching a well into layer 540.

Opening 544 in etch mask 542 has diameter $DIA_{ETCH1}$. The diameter $DIA_{ETCH1}$ of opening 544 is substantially the same as that of the active region of the APD being formed (e.g., a diameter within the range of about 5 to about 100 microns).

Referring now to FIGS. 5B and 5C, layer 540 is subjected to etching process 546 (e.g., RIE, wet etch, etc.). The process is preferably, but not necessarily, run as a timed etch, whereinby the end of time period, etching has proceeded to a desired depth, $DEP_{WELL}$, resulting in well 548. Although depicted as vertical, the side-walls of well 548 are inclined from the vertical by about 5 to 20 degrees (the diameter of the well is slightly smaller at the bottom of the well than at the top) as a function of etch conditions. Depth $DEP_{WELL}$ of well 548 is in a range of about 0.1 to about 1 microns, and more typically about 0.3 to about 0.5 microns.

Figure 6:
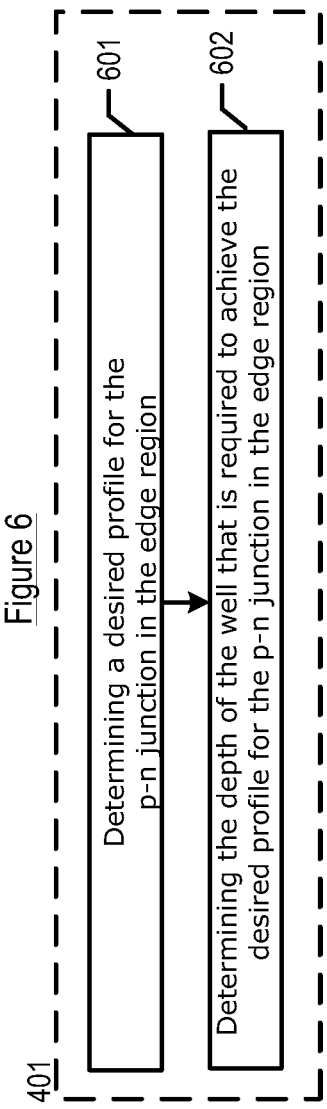
FIG. 6 depicts a method for performing one the operations of the method of FIG. 4.

FIG. 6 depicts a method comprising certain preliminary sub-operations that are performed prior to etching well 548. Those operations include: operation 601, which recites "determining a desired profile for the p-n junction in the edge region and operation 602, which recites "determining the depth of the well that is required to achieve the desired profile for the p-n junction in the edge region."

As previously indicated, the breakdown voltage in the edge region must be greater than the breakdown voltage in the active region. The effect of junction curvature on breakdown voltage is derived from Poisson's equation as:

$$V_e = \frac{V_a}{2}(\eta^2 + 2\eta^{6/7})\ln(1 + 2\eta^{-8/7}) - \eta^{6/7} \quad [1]$$

Wherein:

$V_e$ is the edge-region breakdown voltage;

$V_a$ is the active-region breakdown voltage; and $\eta$ is a function of the radius of curvature of the junction in the edge region, rj.

Figure 7:
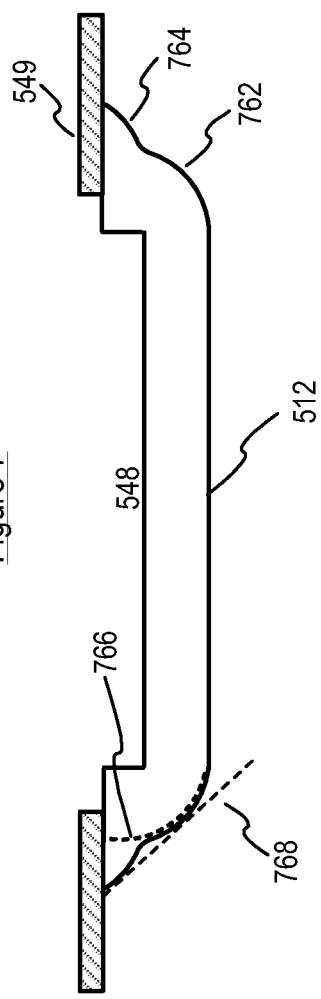
FIG. 7 depicts the shape of the p-n junction, in the edge region of an APD, when formed in accordance with the illustrative embodiment of the present invention.

FIG. 7 illustrates p-n junction 512 and, in particular, the shape of the peripheral portion of that p-n junction. As depicted, diffusion of dopants through well 548, including the sidewall thereof, results in first portion 762 of the p-n junction in the edge region. Diffusion of dopants through the upper surface of the semiconductor unprotected by diffusion mask 549 results in second portion 764 of the p-n junction in the edge region. First portion 762 of p-n junction 512 in the edge region is deeper than well 548.

The shape of the p-n junction in the edge region as a result of the presence of well 548 is similar to what can be achieved in the absence of a well by using two dopant-diffusion operations. Thus, an estimate of breakdown voltage in the edge region can be provided using expression [1], such as would be performed when estimating breakdown voltage in the edge region when dopant diffusion is performed using multiple diffusions (accounting for the different radii of curvature due to the multiple diffusions, as appropriate).

With continued referenced to FIG. 7, line 766 depicts the shape of the p-n junction (offset for clarity) in the edge region, for a single dopant diffusion, if well 548 were not present. Line 768 illustrates the "flattening" effect that two portions 762 and 764 have on the shape of p-n junction 112 as results from doping in the presence of well 548. It is therefore apparent that the p-n junction resulting from a single doping operation in the presence of well 548 will have a higher breakdown voltage (due to a reduced junction curvature effect) than would be the case for a single doping operation in the absence of the well.

As an alternative to calculations based on expression [1], an empirical approach can be pursued. That is, a plurality of APDs can be fabricated, wherein the APDs incorporate wells of varying depth. The effect on breakdown voltage can be measured and a desired well depth can be determined.

Returning to FIG. 4, operation 402 of method 400 recites "forming a diffusion mask on the semiconductor, wherein the diffusion mask includes a diffusion window and a diffusion sink."

Figure 8:
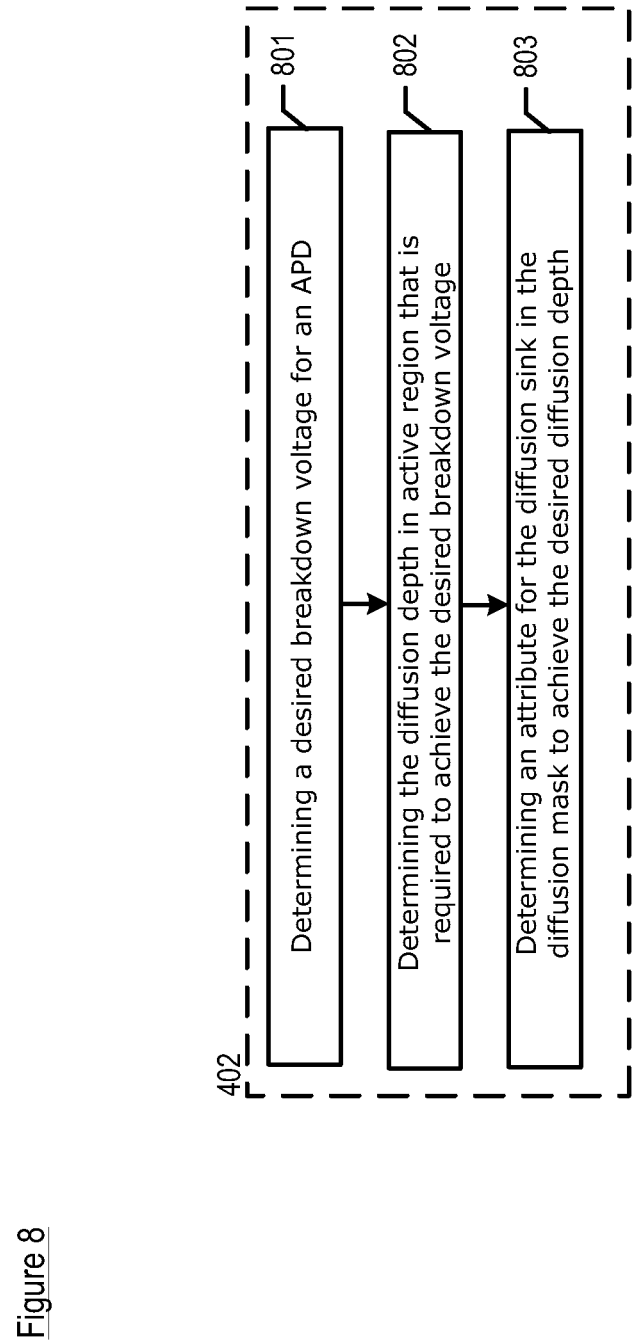
FIG. 8 depicts a method for performing one of the operations of the method of FIG. 4.

FIG. 8 depicts a method comprising certain preliminary sub-operations that are performed before the diffusion mask is actually formed. Sub-operation 701 recites "determining a breakdown voltage for an APD." The desired breakdown voltage is dependent upon the intended use of the APD. One skilled in the art will know how to determine the desired breakdown voltage for an APD as a function of application specifics.

Sub-operation 702 recites "determining the diffusion depth in the active region that is required to achieve the desired breakdown voltage." The desired diffusion depth is, of course, the desired depth of the APD's p-n junction in the device region. There is a well-understood relationship between breakdown voltage and p-n junction depth for a given APD structure. Diffusion depth in active region can therefore be readily determined once a desired breakdown voltage is known.

The desired diffusion depth is then used for "determining an attribute for the diffusion sink in the diffusion mask" per sub-operation 703. In some embodiments, the attribute is a separation distance between the diffusion sink and the diffusion window. In some other embodiments, the attribute is a dimension of diffusion sink, such as the width of the diffusion sink (i.e., the width of the opening). In some further embodiments, the attribute is both a dimension of the sink as well as its separation from the diffusion window. The attribute can be determined using the methods and information disclosed in U.S. Pat. No. 7,964,435.

Figure 5D:
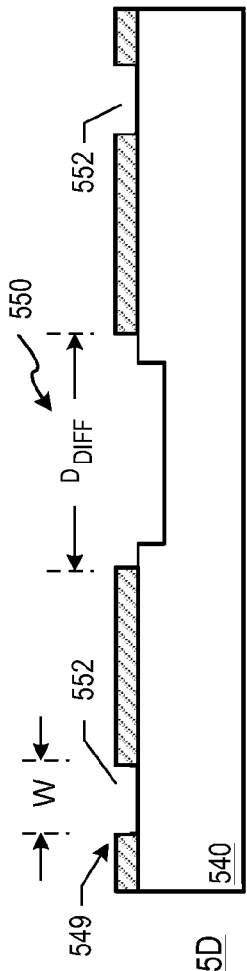

Returning to operation 402, and referring now to FIG. 5D, diffusion mask 549 is formed on semiconductor layer 540. The diffusion mask is formed by depositing a mask layer on layer 540 using conventional deposition techniques. The mask layer comprises a material that inhibits the diffusion of the dopant to underlying semiconductor layer 540. Suitable materials for the mask layer include, without limitation, silicon nitride, silicon dioxide, silicon oxynitrides, glasses, polymers, photoresists, metals, and the like. Those skilled in the art will know how to deposit a mask layer in preparation for forming a diffusion mask.

The mask layer is patterned using conventional photolithography and etching techniques to form diffusion mask 549, which comprises diffusion window 550 and diffusion sink 552. These openings (i.e., window 550 and sink 552) in diffusion mask 549 provide access to underlying semiconductor layer 540. In the illustrative embodiment, diffusion sink 552 and diffusion window 550 are concentric with respect to one another.

Figure 9:
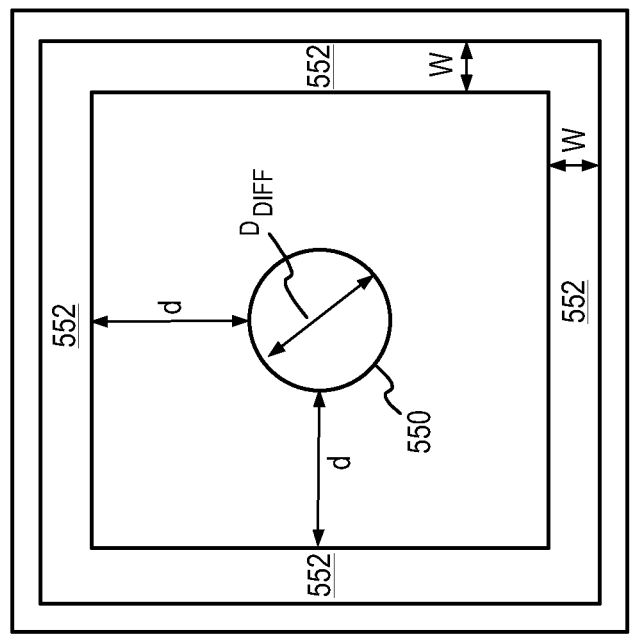
FIG. 9 depicts a top view of a diffusion mask for use in the method of FIG. 4.

With continuing reference to FIG. 5D and now to FIG. 9, in the illustrative embodiment, diffusion window 550 is a circular opening having a diameter, $D_{DIFF}$, of approximately 30 microns, diffusion sink 552 is a square annulus with a width, W, of approximately 10 microns, and diffusion window 550 and diffusion sink 552 are separated by a minimum separation, d, of approximately 35 microns.

The sizes of diffusion window 550, diffusion sink 552, and the separation therebetween can be smaller or significantly larger than for the illustrative embodiment. For guidance, but not by way of limitation, diameter $D_{DIFF}$ of diffusion window 550 is typically, but not necessarily, within the range of approximately 5 microns to approximately 1 millimeter, with like ranges for diffusion sink 552 as well as the separation between the diffusion window and the diffusion sink. More typically, diameter $D_{DIFF}$ of diffusion window 550 is within the range of approximately 5 microns to 200 microns, width W of diffusion sink 552 is within the range of approximately 1 micron to approximately 100 microns, and the minimum separation, d, between diffusion window 550 and diffusion sink 552 is within the range of approximately 2 microns to approximately 100 microns. Although diffusion sink 552 is in the form of a square annulus in the embodiment depicted in FIG. 9, it is to be understood that diffusion sink 552 can have a rectangular shape or can more than four sides. That is, more generally, diffusion sink 552 takes the form of a polygonal annulus or a circular annulus.

Figure 5E:
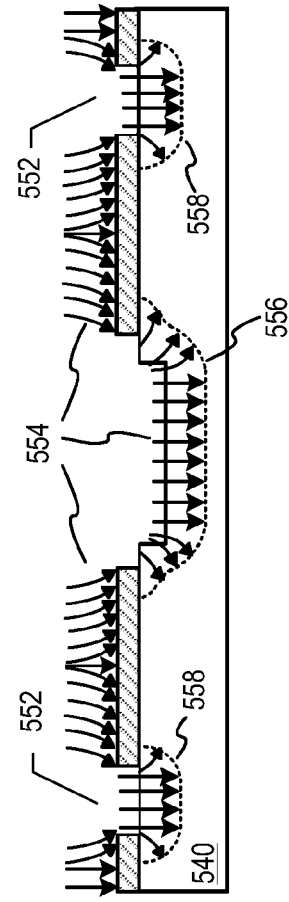

Referring now to FIG. 5E, at operation 403 (FIG. 4), a suitable p-type dopant 554 (e.g., zinc, cadmium, etc.) is diffused into semiconductor layer 540 through diffusion window 550 and diffusion sink 552. Diffusion front 556 progresses through semiconductor 540 beneath diffusion window 550 and diffusion front 558 progresses through semiconductor 540 beneath diffusion sink 552.

Figure 5F:
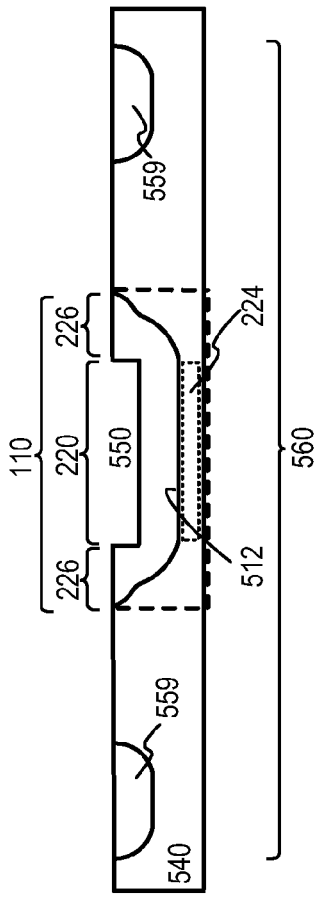

FIG. 5F depicts semiconductor layer 540 at the completion of the single dopant diffusion operation, wherein diffusion region 560 is formed. Diffusion region 560 includes device region 110 and dopant sinks 559. Device region 110, well 550 and dopant sink 559 are concentric with respect to one another.

Device region 110 includes active region 220 and edge region 226. The p-n junction 512 has formed. The depth of p-n junction 512 is uniform in active region 220 and curved in edge region 226. As a consequence of well 548, p-n junction 512 has a somewhat flattened shape; that is, it extends somewhat further laterally that it would when performing a single dopant diffusion operation in the absence of the well. Avalanche multiplication region 224 is below p-n junction 512 in active region 220.

Dopant sink 559 has formed in semiconductor layer 540 as a consequence of dopant 554 that has passed through diffusion sink 552 in diffusion mask 549. Dopant sink 559 is not functional; it plays no role in the operation of APD 1000. The dopant sink 559 is present simply as a consequence of fabrication method. As a consequence of well 550, the portion of p-n junction 512 in active region 220 is deeper in semiconductor layer 540 than dopant sink 559 (since the dopant sink is formed during the same diffusion operation as the p-n junction).

Due to some lateral diffusion, device region 110 and dopant sink 559 typically extend beyond the perimeters of diffusion window 550 and diffusion sink 552, respectively. For the purposes of this disclosure and the appended claims, however, the dopant sink is considered to have the same dimensions as the opening (i.e., the diffusion sink in the diffusion mask) that was used to form it and the dopant sink is considered to be located directly below the diffusion sink. Likewise, the device region is considered to have the same dimensions as the diffusion window and to be located directly beneath it. It follows then that the separation distance between device region 110 and dopant sink 559 is considered to be equivalent to the separation distance between diffusion window 550 and diffusion sink 552.

After forming device region 110, electrical contacts (not depicted) are formed in conventional fashion. One contact is typically formed on top of the cap layer (i.e., semiconductor layer 540) and the other is formed at a convenient location on a lower layer.

Method 400 as described above can be used to form multiple APDs and APD arrays, such as by using the techniques described in U.S. Pat. Nos. 8,044,436, 8,133,755, and U.S. Publ. Pat. App. No. 2012/0133014, appropriately extended to include the formation of the well as disclosed herein.

Figure 10:
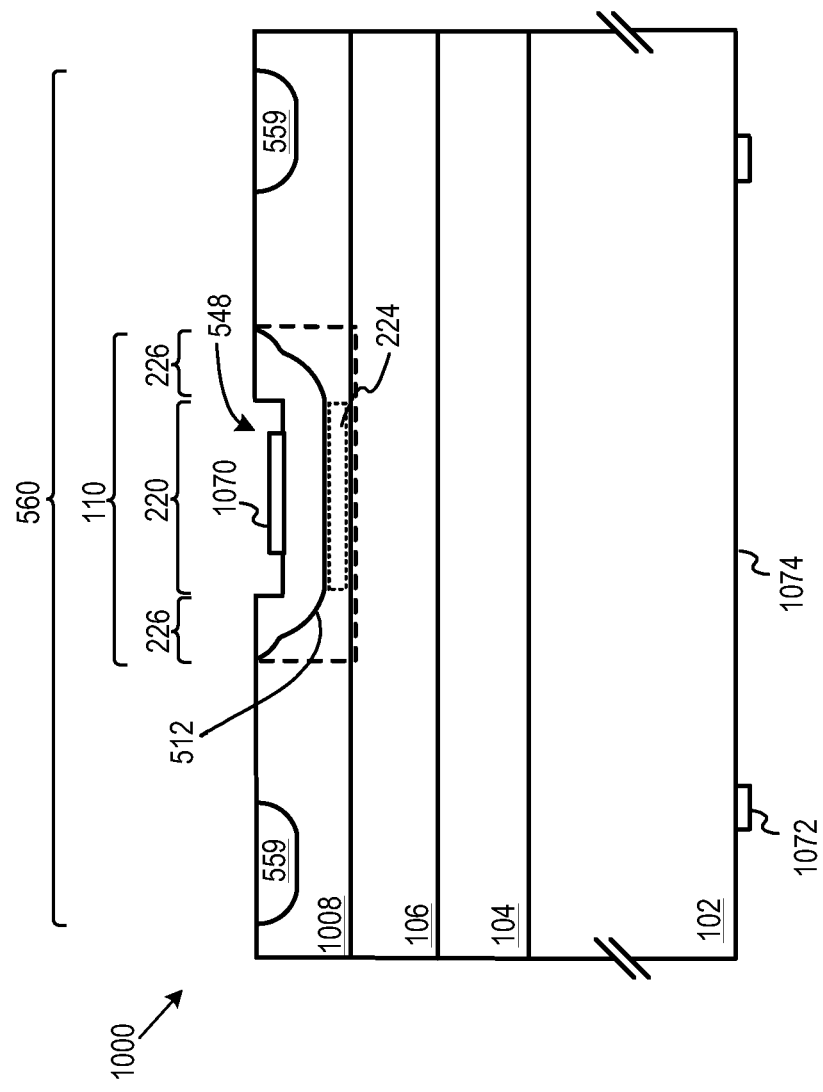
FIG. 10 depicts an APD formed in accordance with the method of FIG. 4.

FIG. 10 depicts APD 1000 formed in accordance with the present teachings. APD 1000 includes substrate 102, absorption layer 104, charge control layer 106, and cap layer 1008. Layers 102, 104, and 106 are as previously described for existing APDs. APD 1000 also includes upper electrical contact 1070 and lower annular electrical contact 1072. Optical window 1074 is the circular region within annular electrical contact 1072. An anti-reflection coating (not depicted) is disposed on the bottom surface of substrate 102 at the optical window.

Cap layer 1008 includes diffusion region 560, which comprises dopant sink 559 and device region 110. The device region active region 220 and edge region 226. Device region 110 also includes p-n junction 512 and avalanche multiplication region 224. Cap layer 1008 differs from the prior art by virtue of one or more of the following features: well 548, dopant sink 559, and the shape of p-n junction 512 in edge region 226 (for an APD formed from a single dopant diffusion operation).

The illustrative embodiment depicts a single well formed in cap layer 1008. It will be understand that multiple wells could be formed, with successively larger diameters, such that a "stepped" profile is created. This would provide even further ability to tailor the shape of the p-n junction in the edge region, but at the cost of increased processing complexity.

It is to be understood that the disclosure teaches just one example of the illustrative embodiment and that many variations of the invention can easily be devised by those skilled in the art after reading this disclosure and that the scope of the present invention is to be determined by the following claims.

What is claimed is:

1. A method comprising:
    forming a well in a semiconductor layer, wherein the well has a depth that, with a single diffusion of dopant, achieves a desired profile for a peripheral portion of a p-n junction;
    forming a diffusion mask over the semiconductor layer, wherein the diffusion mask comprises a diffusion window and a diffusion sink; and
    diffusing the dopant into the semiconductor layer through the diffusion mask, thereby forming, in a single diffusion of dopant, the p-n junction having the desired profile of the peripheral portion.

2. The method of claim 1 wherein an attribute of the diffusion mask affects the depth to which the dopant diffuses and wherein the attribute is selected to achieve a desired diffusion depth.

3. The method of claim 2 wherein the attribute is a separation distance between the diffusion sink and the diffusion window.

4. The method of claim 2 wherein the attribute is a width of the diffusion sink.

5. The method of claim 1 wherein the diffusion sink comprises a polygonal annulus.

6. The method of claim 1 wherein the diffusion sink and the diffusion window are concentric with respect to one another.

7. The method of claim 1 wherein the operation of forming a well further comprises:
    determining a desired profile for the peripheral portion of the p-n junction; and
    determining the depth of the well required to achieve the desired profile for the peripheral portion of the p-n junction.

8. The method of claim 1 wherein the operation of forming the diffusion mask further comprises:
    determining a desired breakdown voltage for an avalanche photodiode to be formed via the method; and
    determining the depth to which the dopant is to be diffused through the diffusion window based on the desired breakdown voltage.

9. The method of claim 2 further comprising determining the attribute of the diffusion sink that achieves the desired diffusion depth.

10. A method comprising:
    forming a well in a semiconductor layer, wherein the well has a depth that achieves a desired profile for a peripheral portion of a p-n junction;
    forming a diffusion mask over the semiconductor layer, wherein the diffusion mask comprises a diffusion window and a diffusion sink, and wherein a separation distance between the diffusion window and the diffusion sink is selected to achieve a desired diffusion depth; and
    diffusing dopant through the diffusion mask into the semiconductor layer to form, in a single dopant diffusion, the p-n junction at the desired depth and having a peripheral portion with the desired profile.

11. A method comprising:
    forming a well in a semiconductor layer, wherein the well has a depth that achieves a desired profile for a peripheral portion of a p-n junction;
    forming a diffusion mask over the semiconductor layer, wherein the diffusion mask comprises a diffusion window and a diffusion sink, and wherein a width of the diffusion sink is selected to achieve a desired diffusion depth; and
    diffusing dopant through the diffusion mask into the semiconductor layer to form, in a single dopant diffusion, the p-n junction at the desired depth and having a peripheral portion with the desired profile.

* * * * *